United States Patent [19]

Tsuruta et al.

[11] Patent Number: 5,010,474
[45] Date of Patent: Apr. 23, 1991

[54] ELECTRONIC PARTS POSITIONING APPARATUS

[75] Inventors: Shigeru Tsuruta, Ohizumimachi; Sadao Masuda, Menumamachi, both of Japan

[73] Assignee: Sanyo Electric Co., Ltd., Morigushu, Japan

[21] Appl. No.: 298,178

[22] Filed: Jan. 17, 1989

[30] Foreign Application Priority Data

Jan. 19, 1988 [JP] Japan .................................. 63-8869

[51] Int. Cl.$^5$ .......................................... G05B 19/18
[52] U.S. Cl. .................................. 364/167.01; 29/740; 364/559
[58] Field of Search ............... 364/167.01, 182, 559, 364/491, 490, 468, 560, 561; 318/594, 640; 250/491.1; 29/739, 740, 741, 743; 414/752

[56] References Cited

U.S. PATENT DOCUMENTS

| | | | |
|---|---|---|---|
| 4,135,630 | 1/1979 | Snyder et al. | 214/1 BT |
| 4,312,033 | 1/1982 | Sweeney et al. | 318/594 |
| 4,473,247 | 9/1984 | Itemadani et al. | 294/2 |
| 4,624,050 | 11/1986 | Hawkswell | 29/740 |
| 4,706,379 | 11/1987 | Seno et al. | 364/559 |
| 4,807,356 | 2/1989 | Maruyama et al. | 29/740 |

FOREIGN PATENT DOCUMENTS 0174619 3/1986 European Pat. Off. .

Primary Examiner—Jerry Smith
Assistant Examiner—Paul Gordon
Attorney, Agent, or Firm—Darby & Darby

[57] ABSTRACT

In order to horizontally position a chip part held by a holding unit by a closing operation caused by relative movement of at least two parts of opposing positioning pawls, a setting unit sets information concerning an interval between opposing positioning pawls of each of the two pairs and information of a size of the chip part, a memory unit stores the information set by the setting unit, a calculating unit calculates a distance for increasing a relative moving speed of the positioning pawls at the start of the closing operation and a distance for reducing the relative moving speed at the end of the closing operation on the basis of the information stored in the memory unit, and a control unit controls a driving source for driving the positioning pawls on the basis of the calculation result of the calculating unit, thereby variably controlling the moving speed at the high-speed moving distance of the positioning pawls in accordance with the size of the chip part to reduce a moving time of the positioning pawls required for positioning, performing a positioning operation at high speed.

21 Claims, 11 Drawing Sheets

FIG. 8

| STEP | X DATA | Y DATA | ANGLE | PARTS DATA | SUCTION NOZZLE DATA |
|---|---|---|---|---|---|
| $M_1$ | $X_1$ | $Y_1$ | $Z_1$ | $R_1$ | $N_1$ |
| $M_2$ | $X_2$ | $Y_2$ | $Z_2$ | $R_2$ | $N_2$ |
| ---- | ---- | ---- | ---- | ---- | ---- |
| $M_n$ | $X_n$ | $Y_n$ | $Z_i$ | $R_i$ | $N_i$ |

FIG. 9

| PARTS NAME | PARTS SIZE X | PARTS SIZE Y | SENSEOR DESIGNATION |
|---|---|---|---|
| $R_1$ | $X_{P1}$ | $Y_{P1}$ | $S_1$ |
| $R_2$ | $X_{P2}$ | $Y_{P2}$ | $S_2$ |

FIG. 10

|  | X-DIRECTION DATA | Y-DIRECTION DATA |
|---|---|---|
| POSITIONING PAWL INTERVAL DATA | $X_c$ | $Y_c$ |

FIG. 11

| DIMENSIONAL ERROR ABSORBING DISTANCE DATA | $L$ |
|---|---|

FIG. 12

DIMENSIONAL ERROR ABSORBING DISTANCE DATA          $L = \underline{00}$ —80A

POSITIONING PAWL INTERVAL DATA          $X_c = 0000$
          $Y_c = 0000$

ELECTRONIC PARTS POSITIONING APPARATUS

Background of the Invention (1) Field of the Invention

The present invention relates to an electronic parts positioning apparatus and, more particularly, to an electronic parts positioning apparatus for chucking and conveying a variety of electronic parts such as resistors, capacitors and transistors in the form of chips (to be referred to as chip parts hereinafter) onto a printed circuit board, thereby horizontally positioning the chip parts to be mounted with an arbitrary pattern.

(2) Prior Art

Conventional electronic parts positioning apparatuses of this type are disclosed in U.S. Pat. No. 4,135,630, Japanese Patent Laid-Open (Kokai) No. 61-280700 and the like.

As disclosed in Japanese Patent Laid-Open (Kokai) No. 61-280700, chip parts having different shapes and sizes are housed in parts housing tapes in accordance with the shapes and types and wound around tape reels so that the chip parts can be selectively supplied from a parts supply unit. The chip parts are chucked at predetermined suction positions by a suction nozzle and horizontally positioned by a clamping effect obtained by relative movement of two pairs of opposing positioning pawls. An apparatus having this arrangement has been developed and put into practical use.

In the above conventional apparatus, a closing operation of the positioning pawls is controlled such that a relative moving speed of the pawls is at a low speed only at a portion abutting against the chip parts and at a high speed at a position separated therefrom, thereby positioning the chip parts at a high speed.

The relative movement of the positioning pawls, however, especially a distance for high-speed movement at the position separated from the chip parts is always constant regardless of the size of the chip parts. Therefore, if the relative moving speed of the positioning pawls is set on the basis of the chip parts of a large size, the low-speed moving distance is increased with respect to smaller chip parts. As a result, it takes longer time period for a positioning operation, thereby preventing a high-speed positioning operation.

SUMMARY OF THE INVENTION

The present invention eliminates the drawback of the above conventional electronic parts positioning apparatus and has as its object to provide an electronic parts positioning apparatus for horizontally positioning a chip part held by holding means by a closing operation caused by relative movement of at least two pairs of opposing positioning pawls, comprising setting means for setting information concerning an interval between opposing positioning pawls of each of the two pairs and information of a size of the chip part, memory means for storing the information set by the setting means, calculating means for calculating a distance for moving relatively said positioning pawls at a high speed and a distance for moving relatively said positioning pawls at a low speed for positioning on the basis of the information stored in the memory means, and control means for controlling a driving source for driving the positioning pawls on the basis of the calculation result of the calculating means. As a result, the moving speed at the high-speed moving distance of the positioning pawls is variably controlled in accordance with the size of the chip part to reduce a moving time of the positioning pawls required for positioning, thereby performing a positioning operation at high speed.

It is another object of the present invention to provide an electronic parts positioning apparatus in which the high-speed moving distance of the opposing positioning pawls is calculated on the basis of a surface of the chip part along the longitudinal direction, thereby easily setting the relative moving speed of the positioning pawls.

BRIEF DESCRIPTION OF THE DRAWINGS

FIG. 8 is a schematic view showing the format of NC data of the apparatus shown in FIG. 1;

FIG. 9 is a view for explaining a parts data table of chip parts of the apparatus shown in FIG. 1;

FIG. 10 is a view for explaining apparatus data of the apparatus shown in FIG. 1;

FIG. 11 is a view for explaining dimensional error absorbing distance data of the apparatus shown in FIG. 1;

FIG. 12 is a view for explaining a screen display of a CRT of the apparatus shown in FIG. 1;

DETAILED DESCRIPTION OF THE PREFERRED EMBODIMENT

A preferred embodiment of a parts supply apparatus according to the present invention will be described in detail below with reference to the accompanying drawings.

Figure 1:
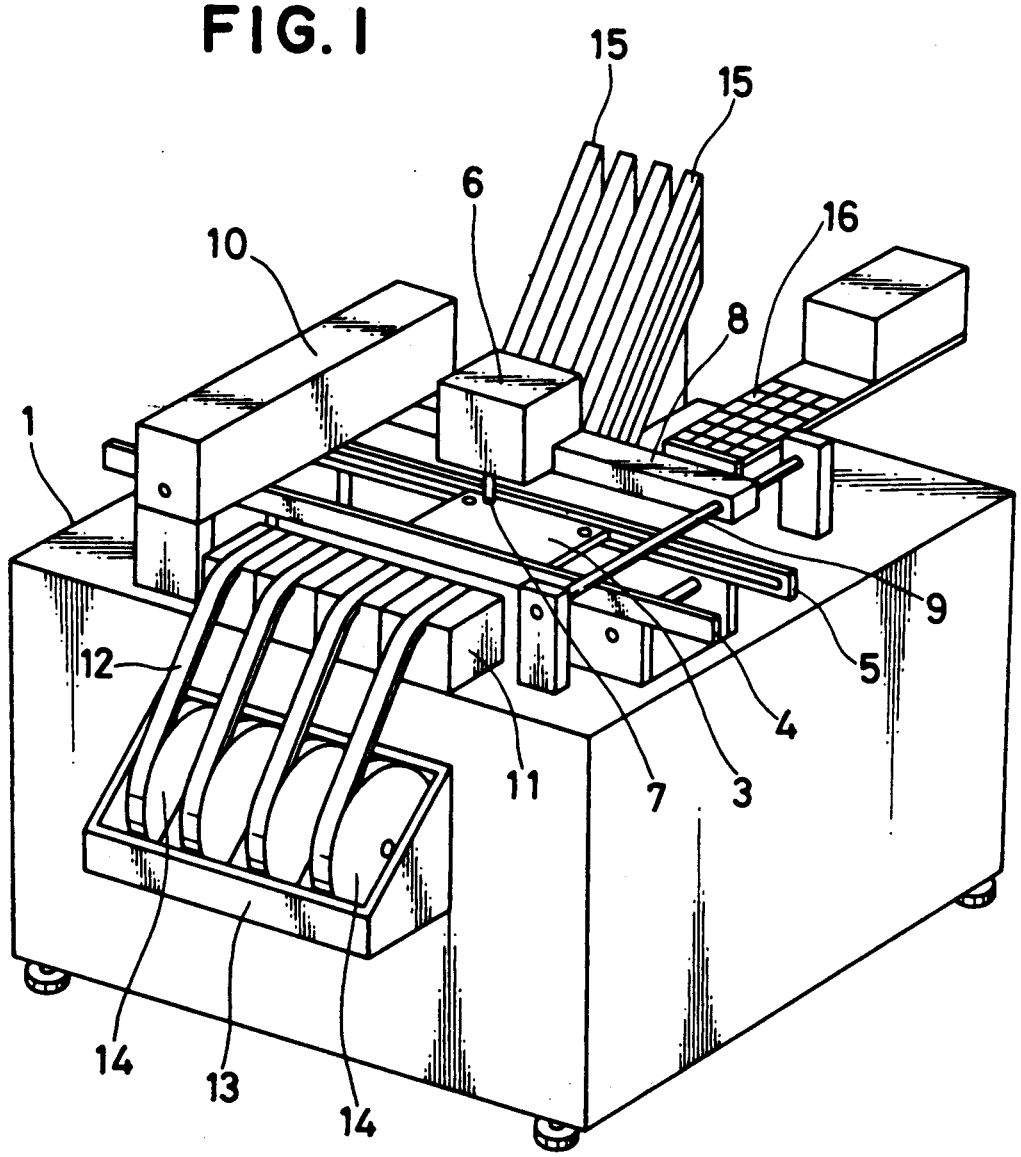
FIG. 1 is a schematic perspective view showing an outer appearance of an embodiment of an overall arrangement of an automatic mounting apparatus incorporating a electronic parts positioning apparatus according to the present invention.
Figure 2:
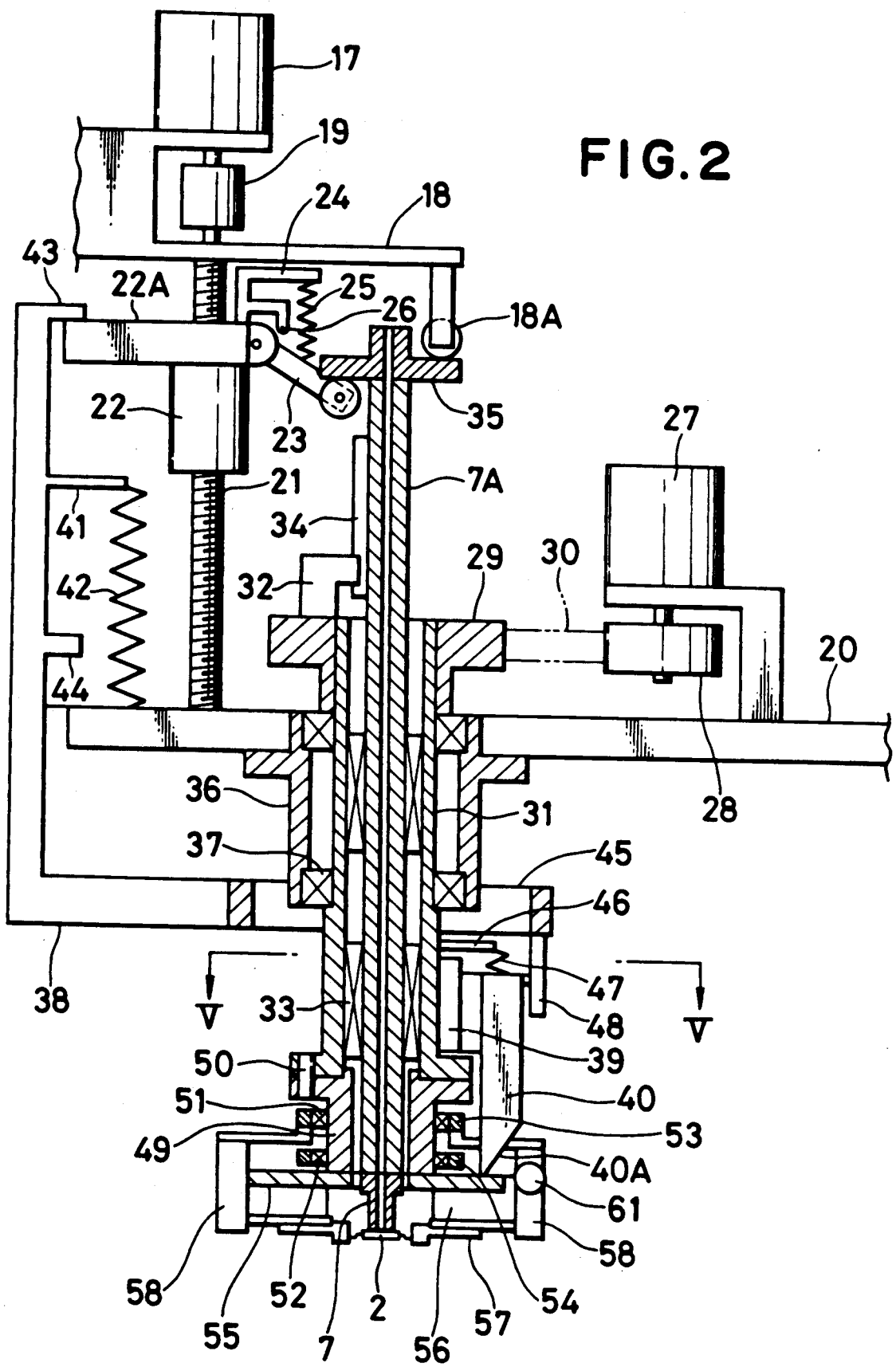
FIG. 2 is a longitudinal sectional side view showing a chip part positioned by positioning pawls of the apparatus shown in FIG. 1.

FIG. 1 shows an overall arrangement of an automatic mounting apparatus incorporating an electronic parts positioning apparatus according to the present invention. Referring to FIG. 1, reference numeral 1 denotes an automatic electronic parts mounting apparatus for mounting a chip-like electronic part 2 on a printed circuit board 3; 4 and 5, a pair of conveyors for conveying the circuit board 3; and 6, a suction head unit having a suction nozzle 7 and the like.

The head unit 6 can be moved along an X-direction guide member 8 in the X direction by an X-direction driving source. The guide member 8 can be moved along Y-direction guide members 9 and 10 by a Y-direction driving source. Therefore, the head unit 6 can move in the X and Y directions.

Reference numeral 11 denotes a tape feeder unit for feeding the electronic parts 2 housed in tapes 12 in units of pitches. Supply reels 14 are housed in box 13. Reference numerals 15 denote parts magazines for housing vertically stacked electronic parts 2; and 16, a parts tray on which the parts 2 are placed.

The head unit 6 will be described below. As shown in FIGS. 2 to 6, reference numeral 17 denotes a positioning servo motor fixed on a support table 18. An output shaft of the motor 17 is coupled through a coupling 19 to a ball screw 21, the end portion of which is supported by a support table 20. The ball screw 21 is fitted in a vertical moving member 22. Therefore, when the motor 17 is powered, the ball screw 21 is pivoted to vertically move the vertical moving member 22. Reference numeral 23 denotes a pivotal lifting arm, one end of which has a cam follower and the other end of which is supported by the moving member 22. The arm 23 is biased upward by a spring 25 extending between a hook portion 24 and the arm 23. An upward pivoting motion of the arm 23 is, however, limited by a stopper 26.

A rotating pulse motor 27 is arranged above the support table 20. A timing belt 30 is looped between an output shaft pulley 28 of the pulse motor 27 and a timing pulley 29. Reference numeral 31 denotes a nozzle guide cylinder. The pulley 29 is located at an upper portion of the cylinder 31. A nozzle detent 32 is connected to the pulley 29.

A nozzle shaft 7A detachably connected to the suction nozzle 7 can vertically move in the guide cylinder 31 through bearings 33. Since the detent 32 is fitted in a detent guide 34 formed at an upper portion of the nozzle 7, the nozzle 7 pivots upon pivoting motion of the timing pulley 29. Reference numeral 35 denotes a rotary disk located at an upper portion of the nozzle shaft 7A and connected to a vacuum source (not shown). The upper surface of the rotary disk 35 can engage with a stopper 18A as a cam follower of the support table 18 to limit upward motion of the suction nozzle 7, and its lower surface engages with the arm 23 and therefore is biased upward by the spring 25.

Reference numeral 36 denotes a support cylinder having bearings 37, located between the nozzle cylinder 31 and the support cylinder 36, for smoothly pivoting the guide cylinder 31. Reference numeral 38 denotes a cam lifting member for vertically moving a positioning pawl opening/closing cam 40 along a cam lifting linear guide formed on the nozzle guide cylinder 31.

A spring 42 extends between a hook portion 41 of the cam lifting member 38 and the support table 30 and biases the lifting member 38 downward. When a locking portion 22A of the vertical moving member 22 abuts against a locking portion 43 of the cam lifting member 38, however, the cam lifting member 38 moves downward together with the vertical moving member 22. In addition, when a stopper 44 abuts against the support table 20, downward movement of the cam lifting member 38 is limited.

A cam opening/closing ring portion 45 is located at the lower portion of the cam lifting member 38 and surrounds the nozzle guide cylinder 31 with a predetermined interval therebetween. A spring 47 extends between a hook portion 46 projecting from the nozzle guide cylinder 31 and each pawl opening/closing cam 40. A cam follower 48 rotatably supported by the cams 40 is urged against the lower surface of the cam opening/closing ring portion 45 by the spring 47. Therefore, regardless of a position of each cam 40 rotated upon rotation of the nozzle guide cylinder 31 and the suction nozzle 7 driven by the motor 27, the cam follower 48 can be urged against the lower surface of the ring portion 45. As a result, upon vertical movement of the cam lifting member 38, the pawl opening/closing cam 40 can be vertically moved.

Reference numeral 49 denotes a support cylinder positioned by a positioning pin 50 and detachably supporting the lower portion of the nozzle guide cylinder 31. Upper and lower rotary rings 53 and 54 are rotatably fitted on the support cylinder 49 through bearings 51 and 52, respectively.

A flange 55 is formed at the lower portion of the support cylinder 49. A pawl linear guide 56 is mounted on the flange 55 and horizontally guides two pairs of positioning pawls 57 for positioning the electronic parts 2 in the X and Y directions. A guide 56A for coupling blocks 58 with the positioning pawls 57 can be moved along the linear guide 56.

A link 59A (59B) is coupled between a coupling block 58A (58B) and a lower rotary ring 54 so that both the ends of the coupling block 58A can be rotated. Similarly, a link 59C (59D) is coupled between a coupling block 58C (58D) and an upper rotary ring 53. Reference numerals 60 denote springs extending from the blocks 58A and 58D to the flange 55, respectively, and bias the positioning pawls to be closed. Cam followers 61 are rotatably mounted on the coupling blocks 58B and 58C, respectively, so that the coupling blocks 58B and 58C are pushed outward by inclined surfaces at the lower ends of the positioning pawl opening/closing cams 40 through the cam followers 61.

The rotary rings 53 and 54 are therefore pivoted clockwise, and the coupling blocks 58A to 58D are pushed outward by the links 59A to 59D, respectively, thereby opening the positioning pawls.

Figure 7:
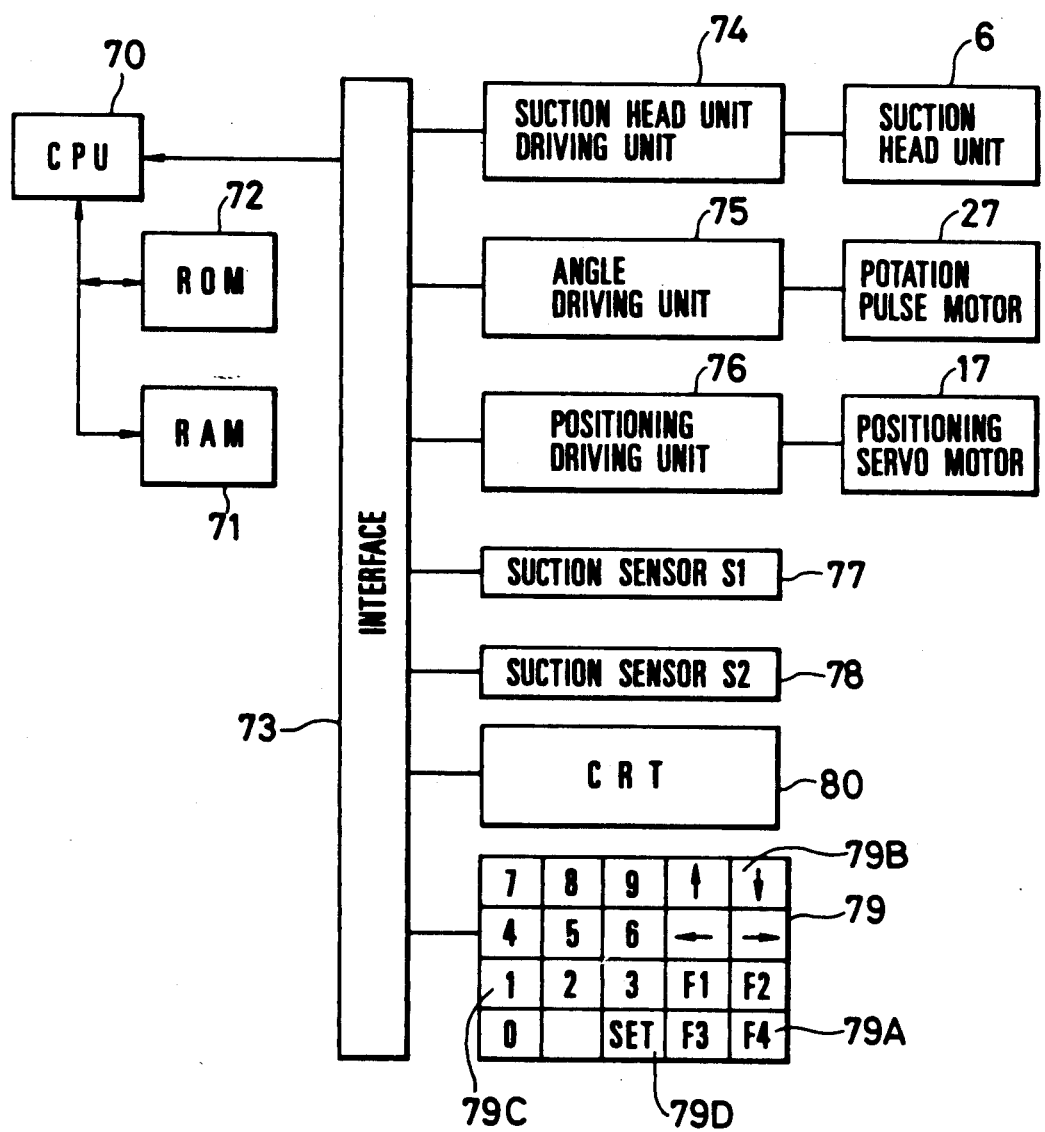
FIG. 7 is a block diagram for explaining positioning control of the apparatus shown in FIG. 1.

A control system of the parts mounting apparatus according to the present invention will be described below. As shown in FIG. 7, reference numeral 70 denotes a CPU as a central control unit for controlling the overall parts mounting operation. Reference numeral 71 denotes a RAM for storing a variety of data concerning parts mounting; 72, a ROM for storing programs converting the mounting operation; 73, an interface; 74, a suction head unit driving unit for driving an X-Y driving source of the suction head unit 6; 75, an angle driving unit for driving the rotation pulse motor 27; 76, a positioning driving unit for driving the positioning servo motor 17; and 77 and 78, suction sensors, comprising vacuum switches, for detecting whether the suction nozzle 7 chucks the electronic part 2 when a vacuum pressure becomes a predetermined level. The sensors 77 and 78 correspond to a small electronic part and a large electronic part, respectively. Reference numeral 79 denotes a key input unit for setting various types of data to be stored in the RAM 71 as a memory; and 80, a CRT for displaying predetermined information upon operation of the key input unit 79.

FIG. 8 shows NC data for determining a mounting position, a mounting angle and a type of the electronic part 2 to be mounted on the printed circuit board 3. FIG. 9 shows a parts data table for determining sizes Xp and Yp in the X and Y directions, respectively, and selecting the suction sensor 77 or 78 in accordance with the size of an electronic part. FIG. 10 shows apparatus data for determining maximum intervals Xc and Yc in the X and Y directions, respectively of the positioning pawls 57A, 57B, 57C and 57D. FIG. 11 shows dimensional error absorbing distance data of the positioning pawls 57A, 57B, 57C and 57D for determining a distance L for moving the positioning pawls even after they abut against the electronic part 2 so as to absorb a dimensional error of the electronic part 2 positioned by the positioning pawls 57A, 57B, 57C and 57D.

The above various data can be arbitrarily set by a variety of key operations at the key input unit 79. For example, an operation of arbitrarily changing/setting the distance L will be described below. When a selection key F4 79A is depressed, the CRT 80 displays information representing the data set mode as shown in FIG. 12. An operator therefore selectively operates cursor command keys 79B to move a cursor 80A and selectively operates numerical keys 79C to arbitrarily set the distance L. Similarly, positioning pawl interval data can be arbitrarily set. By depressing a SET key 79D, the set operation is completed.

The various data set as described above are stored in predetermined areas of the RAM 71.

Figure 3:
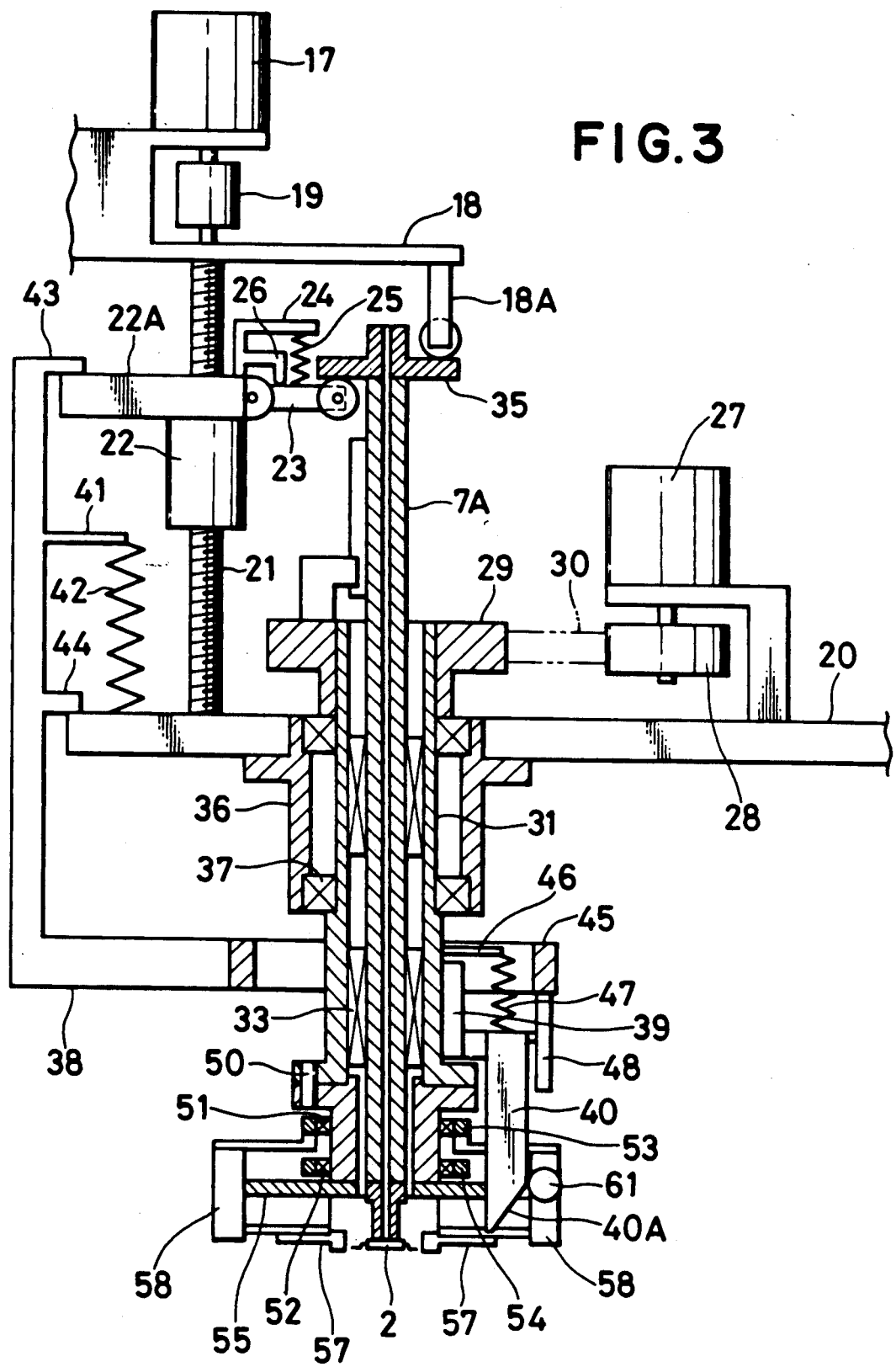
FIG. 3 is a longitudinal sectional side view showing the electronic part chucked by a suction head unit of the apparatus shown in FIG. 1.

An operation of the apparatus having the above arrangement will be described below. In a waiting state, the suction head unit 6 is positioned as shown in FIG. 3. The suction nozzle 7, however, does not shuck the electronic part 2.

Figure 4:
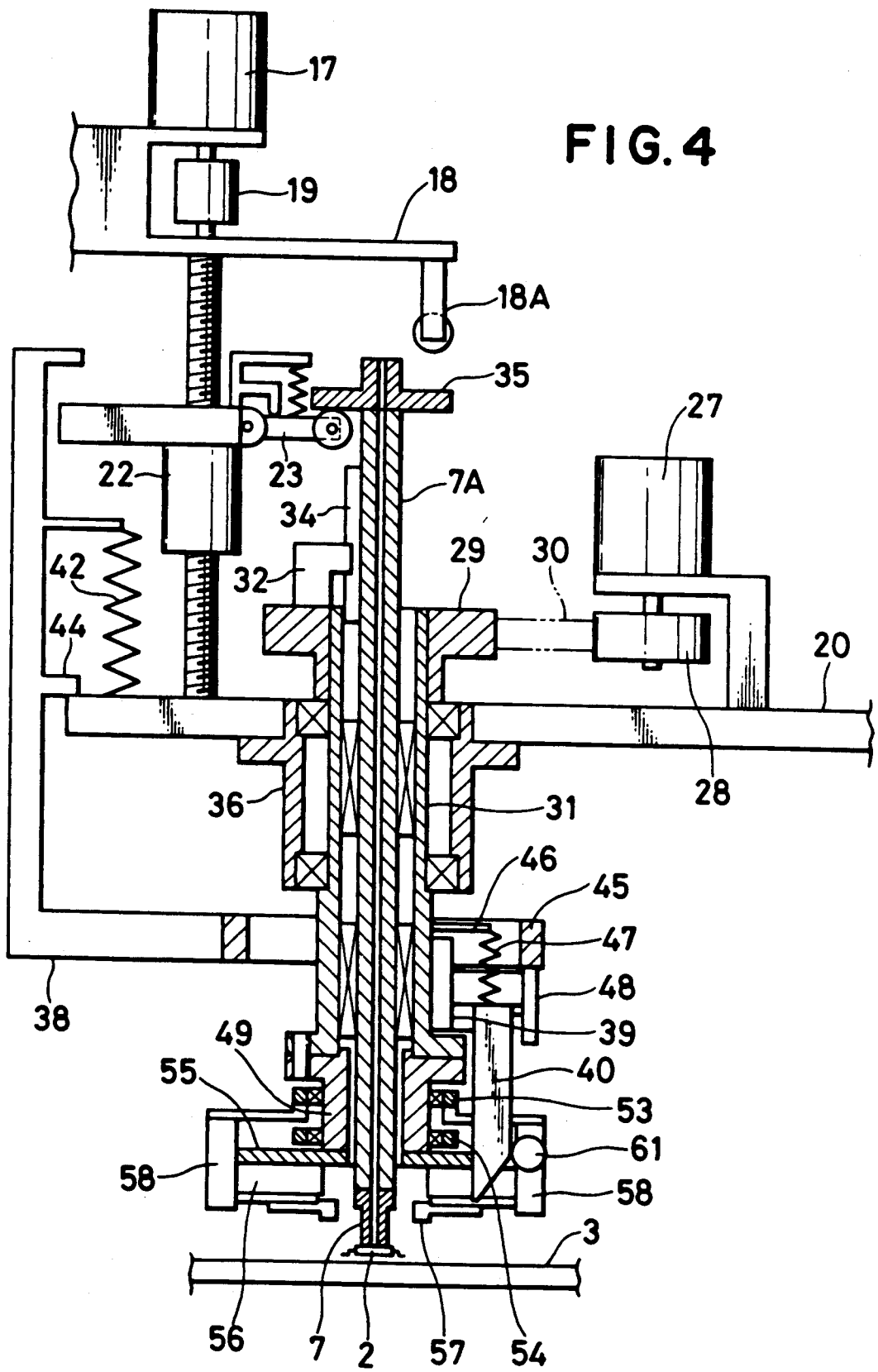
FIG. 4 is a longitudinal sectional side view showing that the positioned chip part is being mounted on a printed circuit board in the apparatus shown in FIG. 1 after the chip part is positioned.
Figure 5:
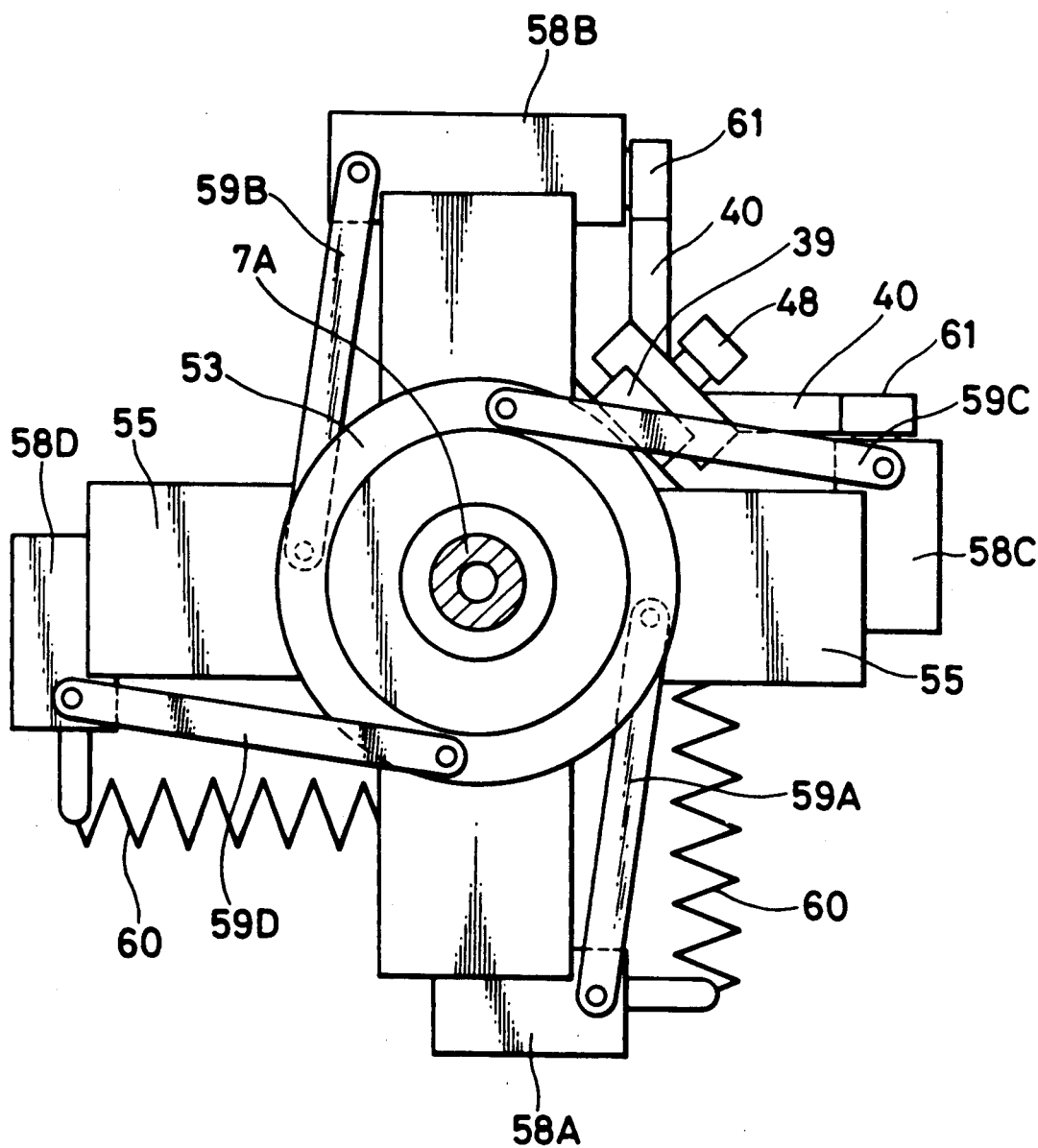
FIG. 5 is a cross-sectional view showing the suction head unit taken along the line V—V in FIG. 2.
Figure 6:
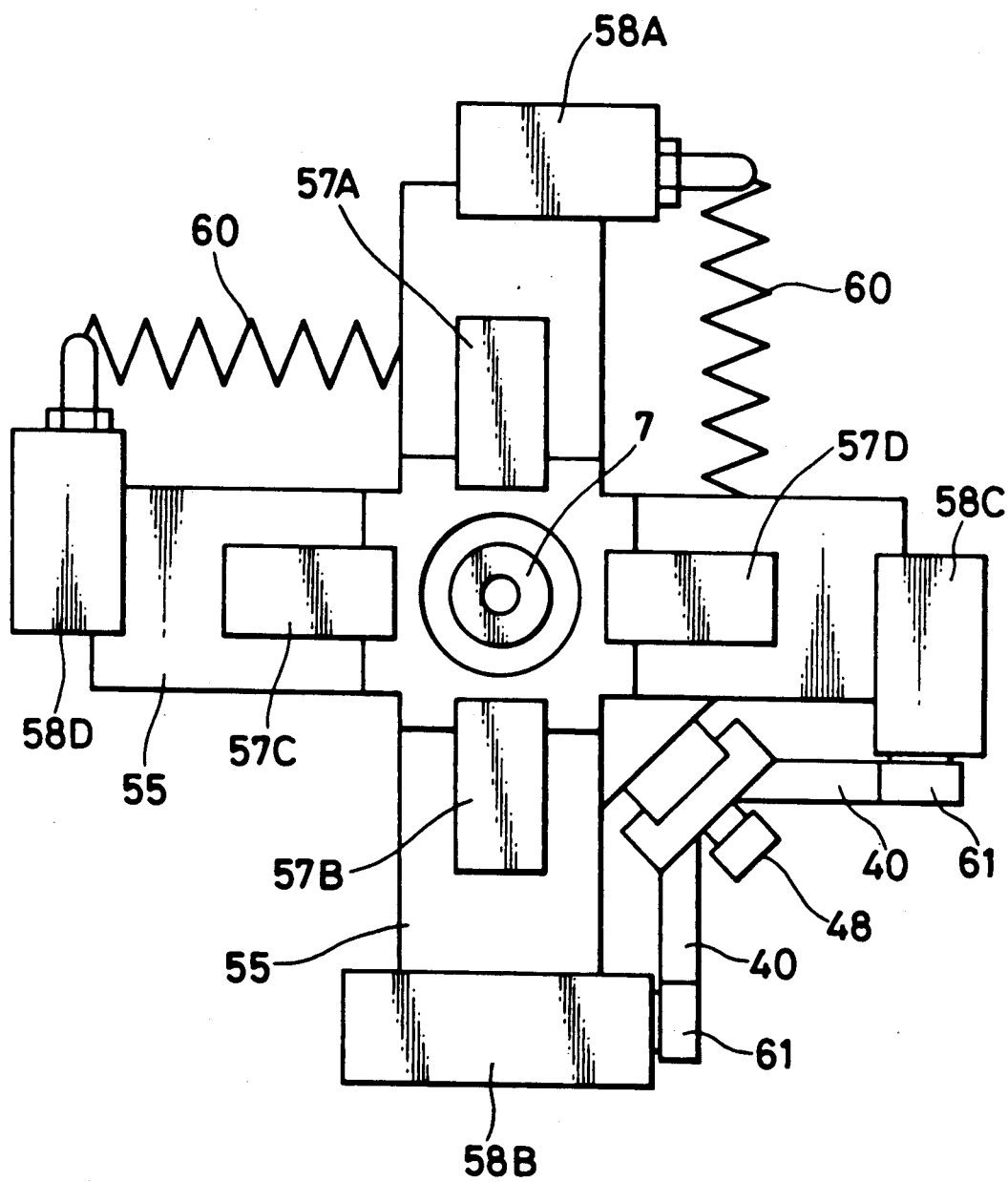
FIG. 6 is bottom view showing the suction head unit of the apparatus shown in FIG. 1.

In this state, the automatic electronic parts mounting apparatus 1 is started under the control of the CPU 70 in accordance with the programs stored in the ROM 72. That is, if the parts data is R1 representing a small electronic part 2, the X- and Y-direction driving sources of the suction head unit 6 are controlled by the suction head unit driving unit 74, and the suction head unit 6 moves immediately above the parts tray 16 accordingly. Thereafter, the suction nozzle 7 is moved downward by the positioning servo motor 17 and chucks the electronic part 2 by the vacuum source as shown in FIG. 4.

The suction sensor S1 77 is already designated upon data setting of the RAM 71 to detect whether the small part 2 is chucked. Therefore, when a vacuum pressure reaches a predetermined value by suction of the suction nozzle 7, the sensor S1 77 is operated, and the CPU 70 fetches a detection output from the sensor S1 77. While the suction nozzle 7 moves upward and horizontally as will be described below, if the CPU 70 determines in accordance with the fetched data that the electronic part is chucked, it continues the mounting operation. If the CPU 70 determines that no electronic part is chucked, it controls the suction head unit driving unit 74, the positioning driving unit 76 and the like to restart the suction operation.

In the above suction state, the positioning servo motor 17 is powered to rotate the ball screw 21, thereby moving the vertical moving member 22 upward. In this case, since the lifting arm 23 engages with the rotary disk 35, the suction nozzle 7 and the nozzle shaft 7A are moved upward by the spring 25. The nozzle 7 is smoothly moved upward in the nozzle guide cylinder 31 by the bearing 33. After the nozzle shaft 7A moves upward to some extent, the suction head unit 6 starts moving to a position above a desired position of the printed circuit board 3 on the conveyors 4 and 5 by the driving unit 74 as described above.

When the vertical moving member 22 moves upward, the locking portion 22A abuts against the locking portion 43 of the cam lifting member 38, and the vertical moving member 22 further moves upward against the biasing force of the spring 42. At this time, since the stopper 18A abuts against the rotary disk 35, upward movement of the suction nozzle 7 is limited, and the lifting arm 23 rotates against the biasing force of the spring 25. As the cam lifting member 38 moves upward, the positioning pawl opening/closing cams 40 also move upward while the cam follower 48 is urged against the lower surface of the cam opening/closing ring 45 by the spring 47. Therefore, the engagement between the cams 40 and the cam followers 61 is released, and the coupling blocks 58A, 58B, 58C and 58D are moved inward by the springs 60. As a result, the positioning pawls 57A, 57B, 57C and 57D are closed along the linear guide 56, thereby positioning the electronic part 2 in the X and Y directions.

Figure 13:
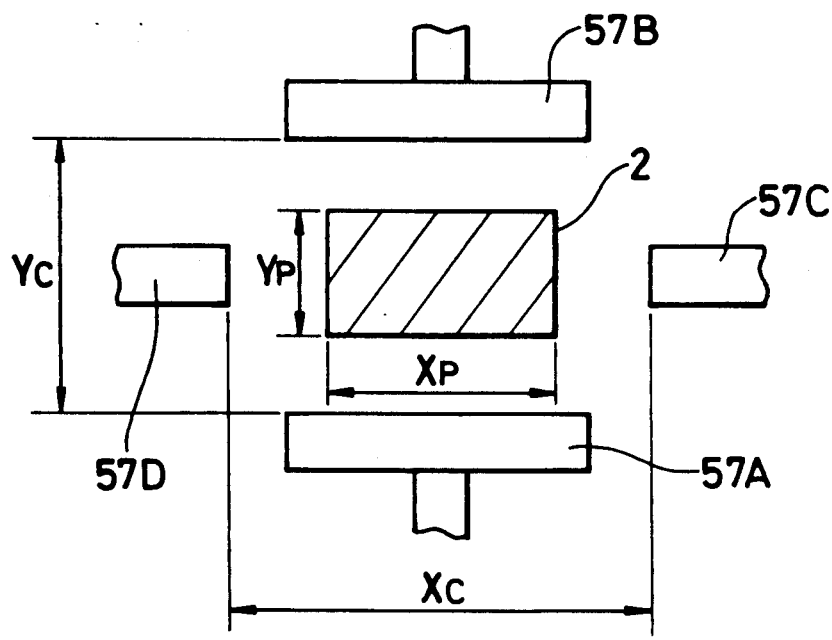
FIG. 13 is a view for explaining distances from the electronic part to the positioning pawls of the apparatus shown in FIG. 1.
Figure 14:
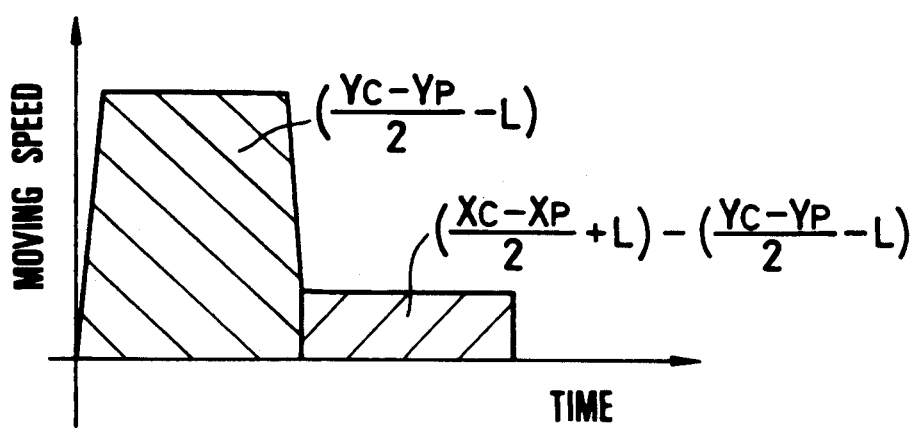
FIG. 14 is a graph for explaining a relationship between a moving speed and a time obtained by a driving source for moving the positioning pawls of the apparatus shown in FIG. 1.

The above positioning operation will be described in more detail below. As shown in FIG. 13, the maximum intervals between the positioning pawls 57C and 57D and between the positioning pawls 57A and 57B are determined to be Xc and Yc, respectively, an the sizes in the X and Y directions of the electronic part 2 are Xp and Yp, respectively. Therefore, in order to increase an operation speed of positioning the electronic part 2 by the positioning pawls 57A, 57B, 57C and 57D, the dimensional error L produced by size variations in the respective electronic parts 2 must be taken into consideration. For this reason, a distance is calculated by subtracting the dimensional error L from $(Yc-Yp)/2$ theoretically required for positioning the electronic part 2 in the Y direction. The positioning servo motor 17 is driven at high speed by only the calculated distance and at low speed for the rest, as shown in FIG. 14.

That is, a distance is calculated by subtracting the distance required for high-speed driving from a distance obtained by adding the dimensional error L to $(Xc-Xp)/2$ theoretically required for positioning in the X direction. The servo motor is driven at low speed by the calculated distance.

In the above embodiment, L is determined to be a size error in consideration of the size variations in electronic parts 2. The value L, however, can be arbitrarily set by an operation at the key input unit 79.

Figure 15:
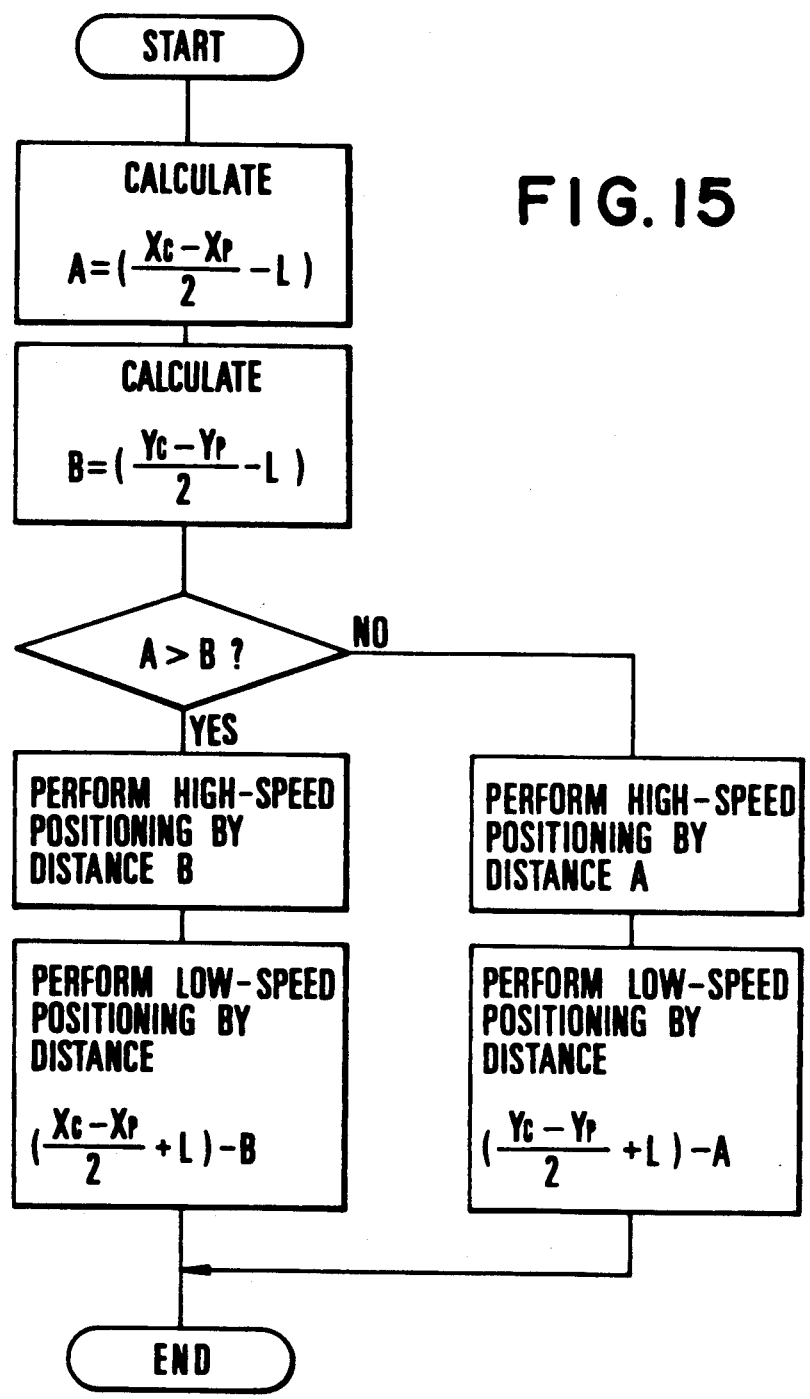
FIG. 15 is a flowchart for explaining positioning control of the apparatus shown in FIG. 1.

In addition, as shown in the flowchart of FIG. 15, the electronic part 2 can be set in two ways with respect to the positioning pawls 57A, 57B, 57C and 57D. That is, a horizontal longitudinal direction of the electronic part 2 can be set along either the X or Y direction. In consideration of this situation, the servo motor may be driven at high speed for a time interval substantially corresponding to a distance between a pair of positioning pawls abutting against the electronic part 2 first, and driven at low speed for the rest. In this case, the CPU 70 calculates a distance A on the basis of the interval data Xc between the positioning pawls 57C and 57D in the X direction and the size data Xp of the electronic part 2 in the X direction. Similarly, the CPU 70 then calculates a distance B on the basis of the interval data Yc and the size data Yp. If A>B, the CPU 70 drives the servo motor 17 at high speed by only the distance B, i.e., a distance obtained by subtracting the dimensional error L from (Yc−Yp)/2 to move the positioning pawls 57A, 57B, 57C and 57D at high speed for performing high-speed positioning. The positioning pawls 57A, 57B, 57C and 57D are moved at low speed by the remaining distance, thereby performing positioning.

If the relationship between A and B does not satisfy A>B, positioning is performed at high speed by only the distance A, i.e., a distance obtained by subtracting L from (Xc−Xp)/2 and at low speed by the remaining distance.

The electronic part 2 positioned as described above is mounted by the suction head 6 on a desired position, i.e., a coordinate position (X1, Y1) of the printed circuit board 3 placed on the conveyors 4 and 5.

That is, the positioning servo motor 17 is reversely rotated to move the vertical moving member 22 downward through the ball screw 21. In this case, while the lifting arm 23 supports the suction nozzle 7 by the spring 25 and urges the rotary disk 36 against the stopper 18A, the vertical moving member 22 and the cam lifting member 38 are moved downward. When the stopper 44 abuts against the support table 20, downward movement of the cam lifting member 38 is stopped. As the vertical moving member 22 moves downward, however, the suction nozzle 7 moves downward.

As the cam lifting member 38 moves downward, the positioning pawl opening/closing cams 40 horizontally move the cam followers 61 outward, thereby opening the positioning pawls 57A, 57B, 57C and 57D. In this manner, since the suction nozzle 7 moves downward while the pawls are gradually opened, the electronic part 2 is mounted on the printed circuit board 3.

In order to change the mounting direction of the electronic part 2, after the Y-direction positioning is performed and before the suction nozzle 7 moves downward, the rotation pulse motor 27 may be controlled to be rotated through a predetermined angle on the basis of angle data Z1 of the RAM 71 by the angle driving unit 75. That is, the nozzle guide cylinder 31, the support cylinder 49, the detent 32, the suction nozzle 7 regulated by the guide 34, the support cylinder 49, the positioning pawls 57A, 57B, 57C and 57D regulated by the linear guide 56, and the like are rotated through a predetermined angle by the motor 27 through the belt 30.

A mounting operation for the next electronic part is similarly performed. In this case, as shown in FIG. 8, the parts data is R2, i.e., the electronic part 2 is comparatively large. At this time, as shown in FIG. 15, a distance A is calculated by subtracting the dimensional error L from (Xc2−Xp2)/2, and a distance B is calculated by subtraction 10 the dimensional error L from (Yc2−Yp2)/2. If A>B, the positioning servo motor 17 is controlled such that the positioning pawls 57A, 57B, 57C and 57D are moved at high speed by the distance B and at low speed by the remaining distance. If the relationship between the A and B does not satisfy A>B, the motor 17 is controlled such that the positioning pawls are moved at high speed for the distance A and at low speed by the remaining distance.

The suction sensor S2 78 for large electronic parts 2 is used to detect whether the electronic part 2 is chucked. In accordance with a detection output from the sensor S2 78, the CPU 70 continues the mounting operation or restarts the suction operation.

What is claimed is:

1. An electronic parts positioning apparatus for horizontally positioning a chip part held by holding means after a closing operation is effected by relative movement of at least two pairs of opposing positioning pawls, comprising:

setting means for setting information concerning an interval between opposing positioning pawls of each of said two pairs and information concerning a size of said chip part;

memory means for storing the information set by said setting means;

calculating means for calculating a distance for moving relatively said positioning pawls at a high speed and a distance for moving relatively said positioning pawls at a low speed thereafter and for positioning on the basis of the information stored in said memory means; and control means for controlling a driving source for driving said positioning pawls toward each other so that said positioning pawls may at first move at the high speed and thereafter move at the low speed, in correspondence with each said distance calculated by said calculating means.

2. An apparatus according to claim 1, wherein said driving source is connected to said positioning pawls through elastic means.

3. An apparatus according to claim 2, wherein a high-speed moving distance of said opposing positioning pawls is calculated on the basis of distance between said chip part and said two pairs of positioning pawls when said positioning pawls are open.

4. An apparatus according to claim 2, wherein a high-speed moving distance of said opposing positioning pawls is calculated on the basis of a shorter distance of the distances between said chip part and said two pairs of positioning pawls when said positioning pawls are open.

5. An apparatus according to claim 2, wherein said two pairs of positioning pawls are operated in synchronism with each other.

6. An apparatus according to claim 1, wherein a high-speed moving distance of said opposing positioning pawls is calculated on the basis of distance between said chip part and said two pairs of positioning pawls when said positioning pawls are open.

7. An apparatus according to claim 6, wherein said two pairs of positioning pawls are operated in synchronism with each other.

8. An apparatus according to claim 1, wherein a high-speed moving distance of said opposing positioning pawls is calculated on the basis of a shorter distance of the distance between said chip part and said two pairs of positioning pawls when said positioning pawls are open.

9. An apparatus according to claim 8, wherein said two pairs of positioning pawls are operated in synchronism with each other.

10. An apparatus according to claim 1, wherein said two pairs of positioning pawls are operated in synchronism with each other.

11. An electronic parts positioning apparatus for horizontally positioning a chip part held by holding means after a closing operation is effected by relative movement of at least two pairs of opposing positioning pawls, comprising:

setting means for setting information concerning an interval between opposing positioning pawls of each of said two pairs and information concerning a size of said chip part;

memory means for storing the information set by setting means;

calculating means for calculating a moving distance of the pawls from a time of beginning the closing operation to a time of changing a relative moving speed on the basis of the information stored in said memory means;

a driving source for driving said positioning pawls; and control means for controlling said driving source so that said positioning pawls may be first move at a high speed and thereafter move at a low speed toward each other, in correspondence with a moving distance of the pawls which was calculated by said calculating means.

12. An apparatus according to claim 11, wherein said driving source is connected to said positioning pawls through elastic means.

13. An apparatus according to claim 12, wherein a high-speed moving distance of said opposing positioning pawls is calculated on the basis of distances between said chip part and said two pairs of positioning pawls when said positioning pawls are open.

14. An apparatus according to claim 12, wherein a high-speed moving distance of said opposing positioning pawls is calculated on the basis of a shorter distance of the distances between said chip part and said two pairs of positioning pawls when said positioning pawls are open.

15. An apparatus according to claim 12, wherein said two pairs of positioning pawls are operated in synchronism with each other.

16. An apparatus according to claim 11, wherein a high-speed moving distance of said opposing positioning pawls is calculated on the basis of distances between said chip part and said two pairs of positioning pawls when said positioning pawls are open.

17. An apparatus according to claim 16, wherein said two pairs of positioning pawls are operated in synchronism with each other.

18. An apparatus according to claim 11, wherein a high-speed moving distance of said opposing positioning pawls is calculated on the basis of a shorter distance of the distances between said chip part and said two pairs of positioning pawls when said positioning pawls are open.

19. An apparatus according to claim 18, wherein said two pairs of positioning pawls are operated in synchronism with each other.

20. An apparatus according to claim 11, wherein said two pairs of positioning pawls are operated in synchronism with each other.

21. An electronic parts position apparatus, comprising:

means for driving positioning pawls relative to each other;

means for controlling said driving means to drive said pawls toward each other first at a high speed for a first distance and then at a low speed for a second distance after which the pawls hold a chip part therebetween, said low speed being slower than said high speed; and means for calculating said first and second distances based on an interval between said pawls and on a size of the chip part to be held so that said first and second distances vary depending upon the size of the chip part.

* * * * *